United States Patent
Tai et al.

(10) Patent No.: US 7,774,930 B2
(45) Date of Patent: Aug. 17, 2010

(54) METHOD OF MANUFACTURING A MICROMACHINED POLYMER BEAM STRUCTURE

(75) Inventors: Yu-Chong Tai, Pasadena, CA (US); Yuji Suzuki, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 767 days.

(21) Appl. No.: 11/492,836

(22) Filed: Jul. 26, 2006

(65) Prior Publication Data
US 2007/0052322 A1    Mar. 8, 2007

Related U.S. Application Data

(63) Continuation of application No. 10/447,586, filed on May 28, 2003, now abandoned.

(60) Provisional application No. 60/383,819, filed on May 29, 2002.

(51) Int. Cl.
*B44C 1/22* (2006.01)
*H05K 3/28* (2006.01)

(52) U.S. Cl. .............. 29/830; 29/852; 216/8; 216/11; 216/41

(58) Field of Classification Search .......... 29/830, 29/847, 852; 216/2, 8, 11, 41
See application file for complete search history.

(56) References Cited

U.S. PATENT DOCUMENTS

| | | | |
|---|---|---|---|
| 5,569,355 A | 10/1996 | Then et al. | |
| 6,146,543 A | 11/2000 | Tai et al. | |
| 6,701,779 B2 | 3/2004 | Volant et al. | |

(Continued)

FOREIGN PATENT DOCUMENTS

JP    06232563 A    *    8/1994    .................. 29/830

OTHER PUBLICATIONS

Berenshot et al, "Thermally Assisted Ion Beam Etching of Polytetrafluoroethylene a New Technique for High Aspect Ration Etching of MEMS", Micro Electro Mechanical Systems, IEEE, pp. 277-284, Feb. 1996.*

(Continued)

*Primary Examiner*—A. Dexter Tugbang
(74) *Attorney, Agent, or Firm*—J. Steven Rutt; Foley & Lardner LLP

(57) ABSTRACT

An integrated composite beam structure. The structure has a substrate, which includes a surface and a thickness defined underlying the surface. The substrate is composed of a first material. A thickness of polymer based material includes a first portion, a length, and a second portion. The second is coupled to a portion of the substrate. The length is defined between the first portion and the second portion. The structure also has a spring constant (K) of less than a predetermined amount (e.g., 10 N/m, 1 N/m) characterizing the length of the polymer based beam structure. The first portion is capable of moving in a first direction characterized by the spring constant upon application of an externally applied force and is substantially fixed in a second direction, which is normal to the first direction. The second end is capable of returning to a predetermined state when the externally applied force has been removed. The second portion includes a selected geometric configuration to secure the second portion to the portion of the substrate.

22 Claims, 16 Drawing Sheets

U.S. PATENT DOCUMENTS 6,794,704 B2    9/2004    Yates et al.

OTHER PUBLICATIONS

Ayon, A. A., et al., "Characterization of a time multiplexed inductively coupled plasma etcher,", J. Electrochem. Soc., vol. 146, pp. 339-349 (1999).

Ayazi, F., et al., "High Aspect-Ratio Combined Poly and Single-Crystal Silicon (HARPSS) MEMS Technology", J. Microelectromech. Syst., vol. 9, No. 3, pp. 288-294 (2000).

Becker, H., et al., "Hot embossing as a method for the fabrication of polymer high aspect ratio structures", Sensors and Actuators, vol. 83, pp. 130-135 (2000).

Berstein, J., et al., "Low-Noise MEMS Vibration Sensor for Geophysical Applications", J. Microelectromech. Syst., vol. 8, No. 4, pp. 433-438 (1999).

Guckel, H., "High-Aspect-Ratio Micromachining Via Deep X-Ray Lithography", Proceedings of the IEEE, vol. 86, No. 8, pp. 1586-1593 (1998).

Harder, T. A., et al., "Residual Stress in Thin-Film Parylene-C", Proc. MEMS 2002, pp. 435-438 (2002).

Horsley, D. A., et al., "Design and Fabrication of an Angular Microactuator for Magnetic Disk Drives", J. Microelectromech. Syst., vol. 7, No. 2, pp. 141-148 (1998).

Suzuki, Y., et al., "Micromachined High-Aspect-Ratio Parylene Beam and Its Application to Low-Frequency Seismometer", Proc. Int. Conf. MEMS '03, pp. 486-489 (2003).

Vitek Research Corporation, Parylene, www.vitekres.com/parylenepage.htm. printed May 27, 2003, pp. 1-4.

Weigold, J. W., et al., "Design and Fabrication of Submicrometer, Single Crystal Si Accelerometer", J. Microelectromech. Syst., vol. 7, pp. 518-524 (2001).

International Search Report, PCT/US03/16977, Oct. 26, 2006.

\* cited by examiner

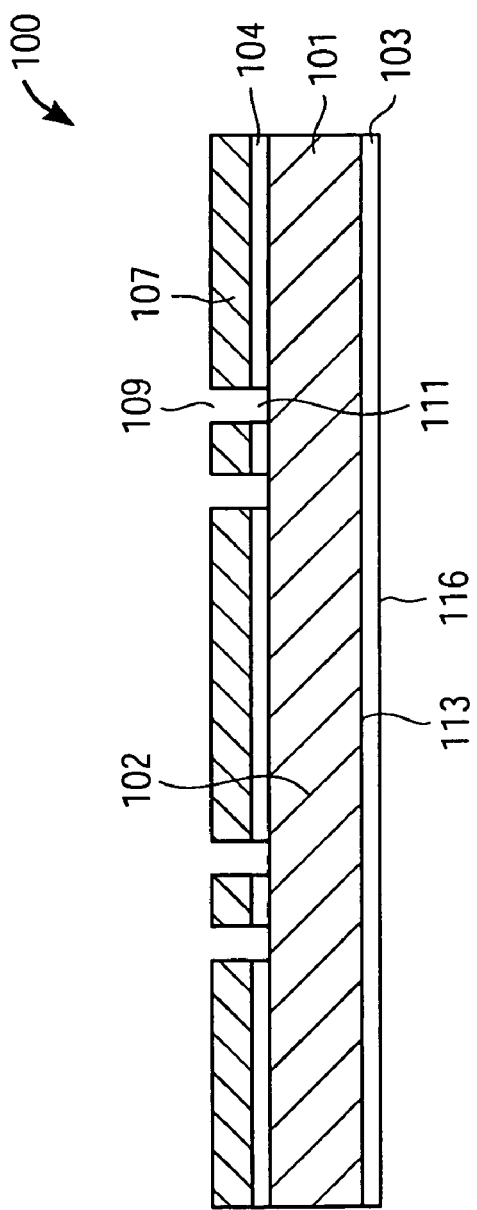
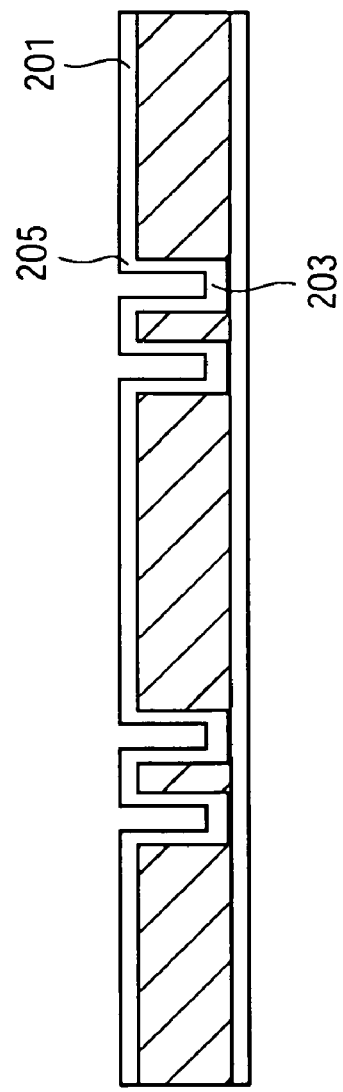
FIGURE 1
FIGURE 2

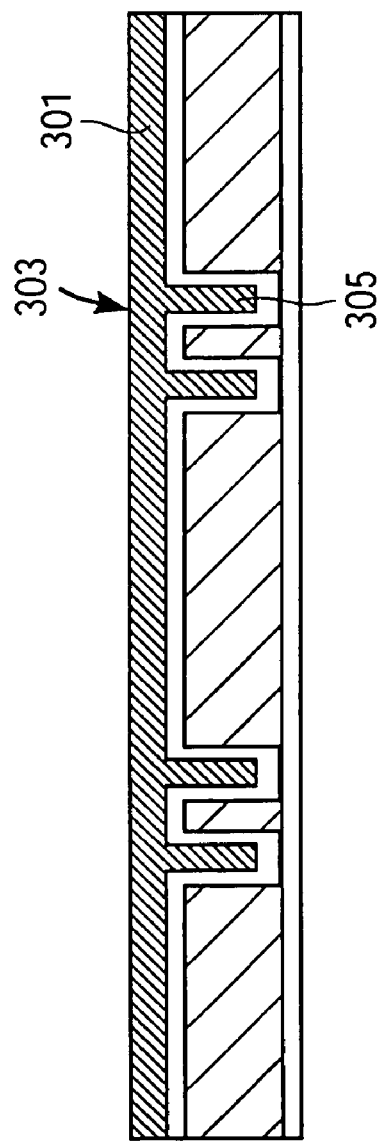
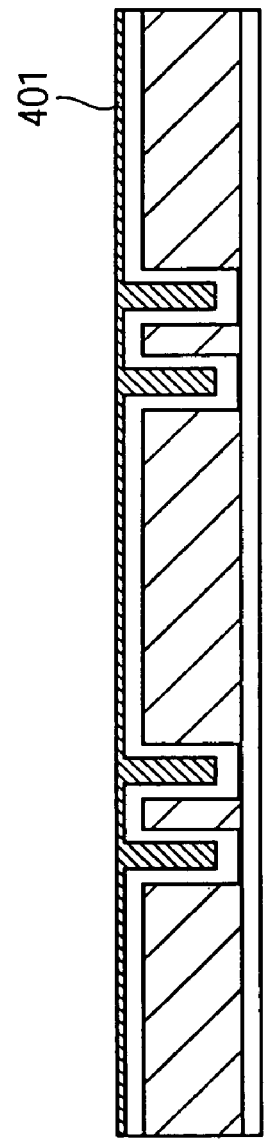
FIGURE 3
FIGURE 4

METHOD OF MANUFACTURING A MICROMACHINED POLYMER BEAM STRUCTURE

CROSS-REFERENCES TO RELATED APPLICATIONS

This application claims priority to U.S. Provisional Nos. 60/383,819 filed on May 29, 2002, commonly assigned, and which are incorporated by reference herein. The application is a Continuation of application Ser. No. 10/447,586, filed on May 28, 2003 (now abandoned).

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention relates generally to microfabrication techniques. More particularly, the invention provides a method and device for manufacturing a beam structure composed of a polymer based material using a micromachining method and apparatus. Merely by way of example, the invention has been applied to the manufacture of a polymer based beam structure for spring applications. But it would be recognized that the invention has a much broader range of applicability. For example, the invention can be applied to micro-electro-mechanical systems, which includes, accelerometers, seismic sensors, optical switching devices, and others.

A Micro-Electro-Mechanical System, commonly called MEMS, is generally a batch-fabricated (microfabricated) system that includes both electrical and mechanical elements. MEMS elements often have characteristic sizes ranging from nanometers to millimeters. MEMS often makes possible certain systems that are smaller, faster, more economical, and energy efficient in some cases. In a general MEMS system, the electrical portion includes integrated circuits, which forms the the thinking part, while the electro-mechanical portion works with the thinking part to control functions and perception.

MEMS generally includes microsensors and actuator devices. Microsensors often gather outside information such as thermal, biological, optical, gravitational, and others. Actuators often respond to user based information to control their environment. As merely an example, mechanical transducers are common examples of MEMS. Such transducers often convert mechanical movement characteristics into electrical characteristics, which are processed. Conventional mechanical transducers are often plagued with limitations for certain applications. Mechanical sensitivity is often difficult to achieve using conventional MEMS based transducers. Here, sensitivity to mechanical force should exist in the direction of interest, but it should be fairly rigid in the other two perpendicular directions to reduce and possibly minimize mechanical cross talk. High aspect ratio structures have been proposed to form sensitive mechanical transducers.

Deep reactive ion etching (DRIE) of silicon substrate was generally used to fabricate high aspect structures for MEMS. An example of DRIE of single crystal silicon has been demonstrated by the BOSCH process, See, Ayon, A. A., Braff, R., Lin, C. C., Sawin, H. H., and Schmidt, M. A., "Characterization of a time multiplexed inductively coupled plasma etcher," J. Electrochem. Soc., 146, (1999), pp 339-349. Other techniques to form high aspect ratio structures used polycrystaline silicon. Unfortunately, many limitations exist in using silicon based materials for high aspect ratio structures. These materials are often brittle and difficult to work with for certain applications. Additionally, the brittle material is often prone to breakage and has other limitations.

Still other conventional techniques rely upon metal materials, which would use X-ray processing. X-ray processing tends to be expensive, which leads to inefficiencies. Moreover, the conventional materials of these technologies have a large Young's modulus on the order of 100 GPa, which cannot be used for a variety of soft structure applications. Accordingly, embossing processes have been proposed to make soft structures for high aspect ratio devices. Embossing also has limitations. Embossing is often difficult to control precisely. Difficult control does not lend itself to forming high aspect ratio devices for MEMS. These and other limitations can be found throughout the present specification and more particularly below.

From the above, it is seen that techniques for manufacturing improved MEMS devices is highly desirable.

BRIEF SUMMARY OF THE INVENTION

According to the present invention, techniques for microfabrication are provided. More particularly, the invention provides a method and device for manufacturing a beam structure composed of a polymer based material using micromachining a method and apparatus. Merely by way of example, the invention has been applied to the manufacture of a polymer based beam structure for spring applications. But it would be recognized that the invention has a much broader range of applicability. For example, the invention can be applied to micro-electro-mechanical systems, commonly called, MEMS, which includes, accelerometers, seismic sensors, optical switching devices, and others.

In a specific embodiment, the invention provides a method for fabricating integrated polymer based structures. The method includes providing a substrate, e.g., silicon wafer, glass substrate, composite structure, multilayed structure. The substrate comprises a surface and a thickness defined underlying the surface. The substrate is composed of a first material, e.g., silicon. The method includes forming (e.g., etching) a recessed region patterned on a portion of the surface of the substrate. The recessed region has a width and a depth characterizing an internal surface portion of the recessed region. The width is defined by a section along a plane that is parallel to the surface of the substrate. The depth is defined by a section from a lower surface region of the recessed region to the portion of the surface of the substrate. The recessed region further has a length, which includes a first portion and a second portion. Certain terms such as "underlying" "lower" "depth" and possibly others are not limited to a specific meaning with respect to a direction parallel to gravity but are used in relation with each other for illustrative purposes.

Preferably, the method forms a thickness of polymer based material (e.g., poly-para-xylylene, polyimide, polycarbonate, polyether ether keton) overlying a portion of the internal surface portion including the lower portion of the recessed region. The polymer based material conforms to the portion of the internal surface portion and the lower portion of the polymer based material. The polymer based material also overlies the first portion and the second portion of the length of the recessed region. The method removes a portion of the substrate within a vicinity of the recessed region to release the first portion of the polymer based material to facilitate a removal of the first portion of the polymer based material from the portion of the substrate while maintaining the second portion of the polymer based material coupled to the portion of the substrate.

In an alternative embodiment, the invention provides an apparatus for sensing spatial movement within a predetermined sensitivity range. The apparatus has a rigid substrate structure and a polymer based beam structure including a first end and a second end. The first end is formed opposite of the second end. The structure also has a length defined therebetween. The first end is coupled to a portion of the substrate structure. The polymer based beam structure has a predetermined width and a predetermined thickness. The second end extends from the rigid substrate structure. The apparatus also has a spring constant (K) of less than a predetermined amount (e.g., 10 N/m, 1 N/m) characterizing the polymer based beam structure. The second end is capable of moving in a first direction characterized by the spring constant upon application of an externally applied force and is substantially fixed in a second direction, which is normal to the first direction. The second end is capable of returning to a predetermined state when the externally applied force has been removed.

In yet an alternative embodiment, the invention provides an integrated composite beam structure. Preferably, the composite beam structure includes a rigid portion and a flexible portion that are integrated with each other. The structure has a substrate, which includes a surface and a thickness defined underlying the surface. The substrate is composed of a first material. A thickness of polymer based material includes a first portion, a length, and a second portion. The second is coupled to a portion of the substrate. The length is defined between the first portion and the second portion. The structure also has a spring constant (K) of less than a predetermined amount (e.g., 10 N/m, 1 N/m) characterizing the length of the polymer based beam structure. The first portion is capable of moving in a first direction characterized by the spring constant upon application of an externally applied force and is substantially fixed in a second direction, which is normal to the first direction. The first portion is capable of returning to a predetermined state when the externally applied force has been removed. The second portion includes a selected geometric configuration (e.g., triangle, annular, trapezoidal) to secure the second portion to the portion of the substrate.

Still further, the invention provides a method for fabricating polymer based structures for manufacture of MEMS elements. The method includes providing a substrate, which has a surface and a thickness defined underlying the surface. The substrate is composed of a first material. The method also includes forming a recessed region patterned on a portion of the surface of the substrate. The recessed region has a width and a depth characterizing an internal surface portion of the recessed region. The width is defined by a section along a plane that is parallel to the surface of the substrate. The depth is defined by a section from a lower surface region of the recessed region to the portion of the surface of the substrate. Preferably, the recessed region is a trench structure. The method forms a thickness of polymer based material overlying a portion of the internal surface portion including the lower portion of the recessed region. The polymer based material conforms to the portion of the internal surface portion and the lower portion of the recessed region. The method removes a portion of the substrate within a vicinity of the recessed region to release a portion of the polymer based material to facilitate a removal of the portion of the polymer based material from the portion of the substrate. The portion of the polymer based material that has been removed forms a molded polymer based structure.

Numerous benefits are achieved using the present invention over conventional techniques, depending upon the embodiment. The present invention provides for microfabrication techniques using conventional chemicals and processes. Preferably, the invention uses conventional materials such as Parylene. The beam structure would include a width ranging from about 10-30 micrometers and an aspect ratio of 10-30, but can also be larger, depending upon the application. In certain embodiments, the invention provides for soft spring applications and has been applied to in-plane seismometers, which cover a low frequency (<1 Hz) and a small acceleration range. Other embodiments include beam structures made of Parylene having widths of 20 um, 30 um, and 40 um corresponding to respective spring constants of 9, 30, and 70 N/m. Additionally for a single 2.5 mm-long Parylene beam structure, the spring constant can be between 1.3E-3 and 1.84 N/m for 10-40 um width beams. The invention provides a resulting beam structure that is not substantially brittle and will not easily break such as conventional silicon based beam structures. Depending upon the embodiment, one or more of these benefits may be achieved. These and other benefits are provided throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIGS. 1-7 are simplified cross-sectional view diagrams illustrating a method for fabricating a beam structure according to an embodiment of the present invention;

DETAILED DESCRIPTION OF THE INVENTION

Figure 5:
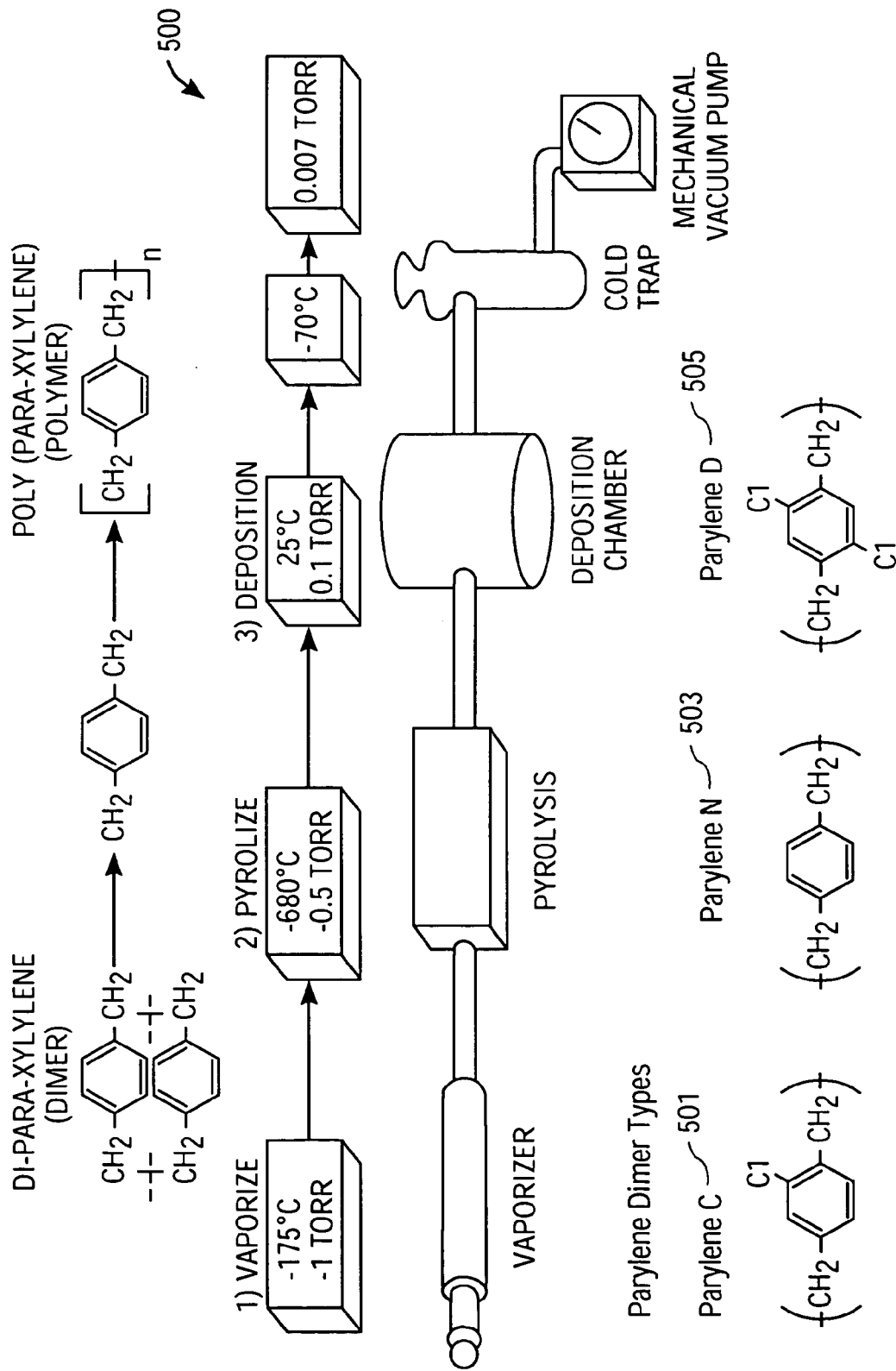

According to the present invention, techniques for microfabrication are provided. More particularly, the invention provides a method and device for manufacturing a beam structure composed of a polymer based material using micromachining a method and apparatus. Merely by way of example, the invention has been applied to the manufacture of a polymer based beam structure for spring applications. But it would be recognized that the invention has a much broader range of applicability. For example, the invention can be applied to micro-electro-mechanical systems, commonly called, MEMS, which includes, accelerometers, seismic sensors, optical switching devices, and others.

A method for fabricating a polymer based beam structure can be outlined as follows:

1. Provide a support substrate, e.g., silicon wafer, which has a surface and a thickness defined underlying the surface;

2. Form an oxide layer (or other dielectric material layer or multi-layers) overlying the surface of the substrate;
3. Form a photolithographic pattern overlying the oxide layer;
4. Define openings in the oxide layer using the photolithographic pattern to pattern the oxide layer, which acts as a hard mask;
5. Form recessed region patterned on a portion of the surface of the substrate through the openings;
6. Continue to form the recessed region to a width and a depth characterizing an internal surface portion of the recessed region;
7. Strip photomasking layer;
8. Form an oxide layer (or other liner material layer or multi-layers) overlying the internal surface portion of the recessed region;
9. Form a thickness of polymer based material overlying the oxide layer that overlies a portion of the internal surface portion including the lower portion of the recessed region to fill the recessed region and also form a thickness overlying the surface of the substrate;
10. Remove a portion of the thickness of the polymer based material while maintaining the filled portions in the recessed regions to form a planarized surface region of the polymer based material;
11. Pattern a backside surface of the substrate to form openings within a vicinity of the recessed regions that have been filled with the polymer based material;
12. Remove a portion of the substrate through the openings within a vicinity of the recessed region to release a portion of the polymer based material to facilitate a removal of the portion of the polymer based material from the portion of the substrate to form a beam structure from the released portion of the polymer based material; and
13. Perform other steps, as desired.

The above sequence of steps provide a method of fabricating a beam structure of polymer based material using micromachining techniques. As shown, the method uses a combination of front side patterning and backside patterning according to a specific embodiment. The method forms the beam structure that is composed of the polymer based material. Preferably, the polymer based material is a Parylene material such as Parylene-C, but can be others. Additionally, certain steps may be combined, one or more steps may be added, and one or more steps may be removed, depending upon the embodiment. The sequence of the steps is changed in certain embodiments. Further details of the present method can be found throughout the present specification and more particularly below.

FIGS. 1-7 are simplified cross-sectional view diagrams illustrating a method for fabricating a beam structure according to an embodiment of the present invention. These diagrams are merely illustrations, which should not unduly limit the scope of the claims herein. One of ordinary skill in the art would recognize many variations, alternatives, and modifications. As shown, the method begins by providing a support substrate structure 100, e.g., silicon wafer, glass substrate, which has a surface 102 and a thickness 101 defined underlying the surface. The structure also includes an oxide layer 104 overlying the surface of the substrate. An oxide layer 116 is also overlying a surface 113 of the substrate. Although such oxide layers have been illustrated, such layer or layers may also include nitrides, a combination of oxide and nitride, and others, which serve as a hard mask to protect 103 surfaces of the substrate. Preferably, the layers 104, 116 are formed using wet oxidation techniques such as steam oxidation and/or wet dipping, as well as others. Of course, one of ordinary skill in the art would recognize many variations, modifications, and alternatives.

As also shown, the method forms a photolithographic pattern 107 overlying the oxide layer. The pattern is often formed by coating the surface with a photosensitive material, which is exposed and then developed. Openings 109 are formed in the photosensitive material. Such openings correspond to trench regions or recessed regions to be formed in the substrate. Etching techniques are often used to form openings in the oxide layer 109 to expose substrate region 111, which will be subjected to reactive ion etching processes or other directional etching processes. Preferably, deep reactive ion etching, commonly called DRIE, is used to form openings, as illustrated by FIG. 2, to define recessed regions or trenches, including sides and lower portions.

The method then forms a layer of dielectric material overlying the sides and bottom regions. The layer of dielectric layer acts as a liner having a predetermined thickness. Preferably, the method includes forming a high quality oxide layer overlying the sides and bottom regions of the trenches using a wet oxidation process, such as a wet dipping process and/or steam oxidation, as well as others. As shown, the oxidation is sufficiently thick to form the liner within each of the trench regions. Preferably, the liner is substantially free from pinholes and is of high quality to form physical isolation between an overlying material and substrate. Depending upon the embodiment, the layer can be replaced with a multilayer structure, including oxides and nitrides, or the like. The photomask layer is stripped using an ashing process. Of course, there can be other variations, modifications, and alternatives.

Referring to FIG. 3, the method forms a thickness of polymer based material 303 overlying the oxide layer that overlies a portion of the internal surface portion including the lower portion of the recessed region. The polymer based material fills each of the recessed regions and is also grown on the exposed surfaces of the substrate. Preferably, the polymer based material is Parylene, which is a commercial name for polymers that belong to a chemical family called poly-para-Xylylene. Parylene is often deposited using gaseous monomers. Such monomers are polymerized and deposited on the substrate, including the trench region, as a pinhole-free and stress-free solid film with selected physical, thermal, electrical, barrier, and biocompatible properties. As shown, Parylene is a conformal protective polymer coating material that conforms to interior surfaces of the trench region, including bottom region, vertical sides, and edges. Parylene exhibits dielectric strength, high surface and volume resistivities, and electrical properties that may be independent of temperature. It also provides a substantially conformal, pinhole-free coating that is corrosion resistance and provides dielectric protection. Before going to FIG. 4, we shall briefly discuss deposition techniques of Parylene using a vacuum chemical vapor deposition process of FIG. 5.

Referring to FIG. 5, Parylene is applied at a molecular level by a vacuum deposition process at ambient temperature or other temperatures. As shown, the vacuum deposition process includes a vaporizer, a pyrolysis, and a deposition chamber. The deposition chamber is coupled to cold trap, which is coupled to vacuum pump. The vacuum pump maintains vacuum in the chamber. Parylene can be applied at room temperature with certain vacuum deposition equipment that permits control of coating rate and thickness. The deposition process takes place at the molecular level as the chemical, in dimer form, is converted under vacuum and heat to dimeric gas, pyrolized to cleave the dimer, and deposited as a clear polymer film. Depending upon the embodiment, Parylene may come in one of a variety of forms such as Parylene C 501, Parylene N 503, and Parylene D 505, which correspond to three dimer variations. Each of the dimer variations could be suited to the requirements of a specific embodiment. Preferably, Parylene C is desirable. Further details of the deposition apparatus and characteristics of Parylene can be found at the website of Conformal-Coating.com, which is provided by Advanced Coating, 10723 Edison Court, Rancho Cucamonga, Calif. 91730. Other properties of Parylene have been provided according to Table 1 below.

Parylene. Either a dry or wet etching process may be used. Other planarizing processes, including mechanical processes or chemical mechanical polishing processes, can also be used. Preferably, the method etches back the Parylene using an oxygen bearing plasma, such as an $O_2$ plasma. As shown, the Parylene has a certain thickness 401 overlying the surface of the substrate, while the Parylene within the trenches has been maintained.

Figure 6:
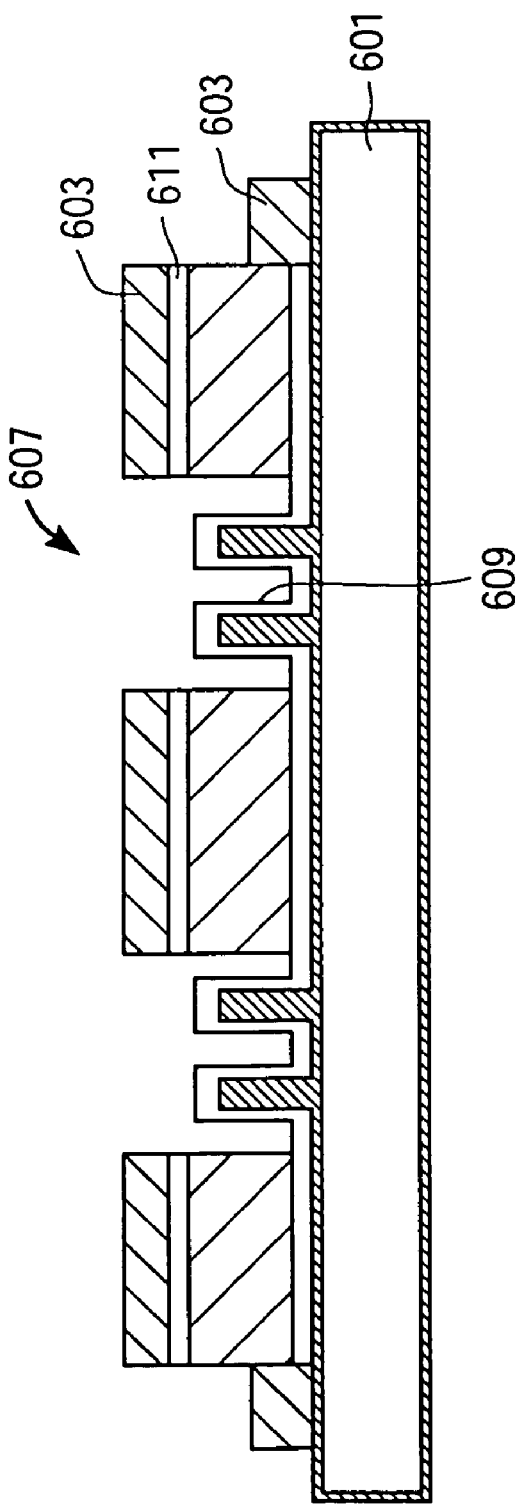

Referring to FIG. 6, the method forms a photolithographic material 603 overlying the backside 116 of the substrate. The photolithographic material is exposed and developed to form

TABLE 1

Properties of Parylene

| FILM PROPERTIES | PROPERTIES of PARYLENE | | |
|---|---|---|---|
| | Parylene N | Parylene C | Parylene D |
| Physical & Mechanical | | | |
| Tensile strength, psi | 6,500 | 10,000 | 11,000 |
| Tensile strength, Mpa | 45 | 69 | 76 |
| Yield strength, psi | 6,300 | 8,000 | 9,000 |
| Yield strength, Mpa | 43 | 55 | 62 |
| Tensile modulus, Mpa | 2,400 | 3,200 | 2,800 |
| Elongation to break, % | 40 | 200 | 10 |
| Density, g/cm2 | 1.110 | 1.289 | 1.418 |
| Coefficient of friction | | | |
| static | 0.25 | 0.29 | 0.33 |
| dynamic | 0.25 | 0.29 | 0.31 |
| Water absorption, % (24 hr) | 0.01 | 0.06 | NA |
| Index of refraction, Nd23 | 1.661 | 1.639 | 1.669 |
| Typical Electrical Properties | | | |
| Dielectric strength, (Volts/mil at 1 mil) | 7,000 | 5,800 | 5,500 |
| Volume resistivity, 23 C., 50% RH (Ohm-cm) | $1 \times 10^{17}$ | $6 \times 10^{16}$ | $2 \times 10^{16}$ |
| Surface resistivity, 23 C., 50% RH (Ohms) | $10^{13}$ | $10^{14}$ | $10^{15}$ |
| Dielectric constant at 60 Hz | 2.65 | 3.15 | 2.84 |
| at 1,000 Hz | 2.65 | 3.1 | 2.82 |
| at 1,000,000 Hz | 2.65 | 2.95 | 2.8 |
| Dissipation factor at 60 Hz | 0.0002 | 0.02 | 0.004 |
| at 1,000 Hz | 0.0002 | 0.019 | 0.003 |
| at 1,000,000 Hz | 0.0006 | 0.013 | 0.002 |
| Typical Barrier Properties | | | |
| Gas Permeability, cc/24 hrs. | | | |
| Nitrogen | 15 | 0.6 | 4.5 |
| Oxygen | 55 | 5 | 32 |
| Carbon dioxide | 420 | 14 | 13 |
| Hydrogen sulfide | 795 | 13 | 1.45 |
| Sulphur dioxide | 1.89 | 11 | 4.75 |
| Chlorine | 74 | 0.35 | 0.55 |
| Moisture Vapor Transmission, gmil/24 hrs | 1.6 | 0.2 | 0.25 |
| Typical Thermal Properties | | | |
| Melting temperature (degrees C.) | 410 | 290 | 380 |
| Linear coefficient of expansion, (10 to the -5th/C.) | 6.9 | 3.5 | NA |
| Thermal conductivity, (10 to the -4th (cal/sec)/(sq cm/cm) | 3 | 2 | NA |

These properties have been provided by Vitek Research Corporation, Vitek Coating Division of 251 Roosevelt Drive, PO Box 315, Derby, Conn. 06418, as merely an example. Depending upon the embodiment, other materials with certain similar properties but different variations can be used. Such materials include, among others, polyimide, polycarbonate, or PEEK, which is polyether ethter keton, combination of these, and the like. Of course, there can be other variations, modifications, and alternatives.

Now referring to FIG. 4, the method reduces a thickness of the polymer based material. Here, the method etches back the openings to expose portions, which are etched, in the backside of the substrate. The exposed portions within the openings are preferably etched through oxide layer 116. The method uses a DRIE process to selectively remove the substrate material from liner material 609, which holds the polymer based material. As shown, the top-side surface is provided on handle 601 substrate, which holds the present substrate structure in place. Depending upon the embodiment, the handle substrate is temporarily attached to the substrate that is work in process.

Figure 7:
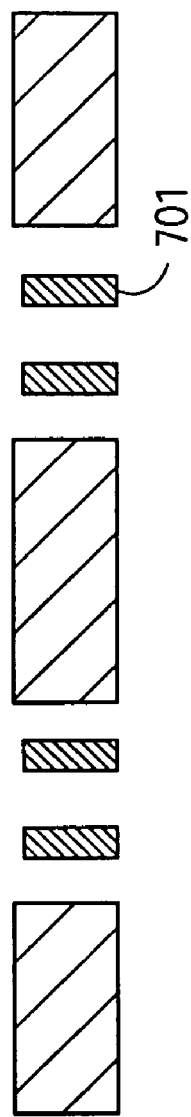

Next, the method selectively removes the oxide liner material to release a portion of the Parylene structures, as illustrated by FIG. 7. Preferably, a wet etchant such as HF (hydrofluoric acid) or BOE (buffered oxide etch) or other etchant is used. As shown, the portion 701 of the polymer based material has been released. Other portions of the polymer based material are still coupled to the substrate structure. Depending upon the embodiment, other steps may be performed. Additionally, certain steps may be combined, one or more steps may be added, and one or more steps may be removed, depending upon the embodiment. The sequence of the steps is changed in certain embodiments. Further details of one or more resulting structures using the present method are provided throughout the present specification and more particularly below.

Figure 8:
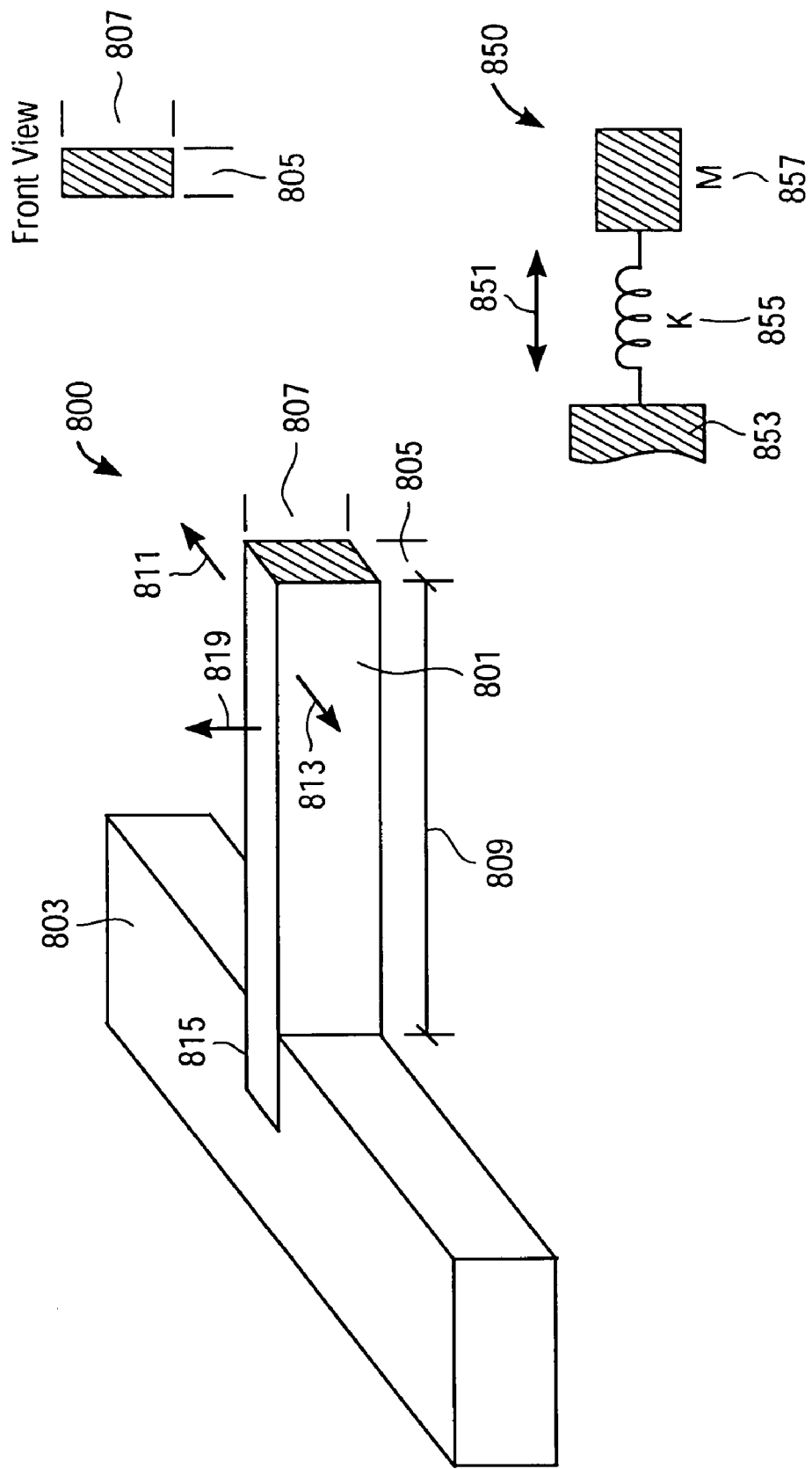
FIG. 8 is a simplified diagram of a spring structure according to an embodiment of the present invention.

FIG. 8 is a simplified diagram of a spring structure 800 according to an embodiment of the present invention. This diagram is merely an example, which should not unduly limit the scope of the claims herein. One of ordinary skill in the art would recognize many variations, modifications, and alternatives. As shown, the spring structure 800 can be applied to an apparatus for sensing spatial movement within a predetermined sensitivity range. Referring to the apparatus of reference numeral 850, the spring structure 855 is coupled to support substrate 853. The spring structure is characterized by spring constant K and may also include mass 857. The spring structure preferably moves in only a single dimension 851 and is substantially fixed in the other two dimensions, which is provided by the high aspect ratio structure.

The high aspect ratio structure is illustrating using the front-view diagram. As shown, the structure includes width 805 and depth or thickness 807. The high aspect ratio structure has been provided on spring structure 800. Here, the spring structure includes a rigid substrate structure 803 and a polymer based beam structure 801 including a first end and a second end. The first end is formed opposite of the second end. The structure also has a length defined therebetween. The first end is coupled 815 to a portion of the substrate structure. Here, the first end was formed in the trench region of the substrate, as shown. The first end is firmly attached to the substrate. The polymer based beam structure has a predetermined width and a predetermined thickness. The second end extends from the rigid substrate structure, as also shown.

The spring structure also has a spring constant (K) of less than a predetermined amount (e.g., 10 N/m, 1 N/m) characterizing the polymer based beam structure. The second end is capable of moving in a first direction 811, 813 characterized by the spring constant upon application of an externally applied force. The second end is also substantially fixed 819 in a second direction, which is normal to the first direction, based upon the configuration of the polymer based beam. Additionally, the polymer based beam is also fixed in a third direction, which is normal to both the first and second directions. The third direction being parallel to the length of the beam structure. The second end is capable of returning to a predetermined state when the externally applied force has been removed. Of course, there can be other variations, modifications, and alternatives.

Figure 9:
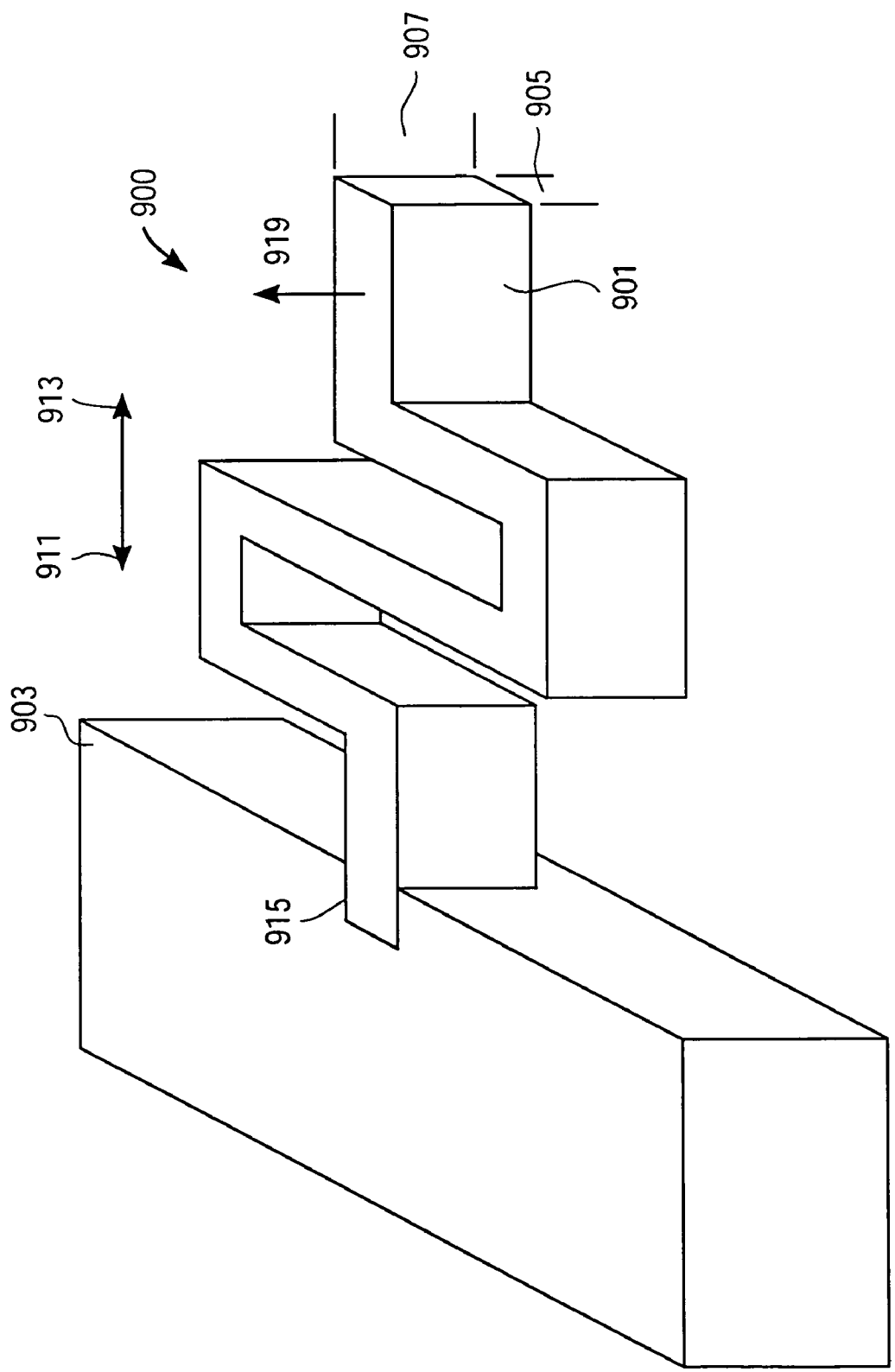
FIG. 9 is a simplified diagram of a folded spring structure according to an embodiment of the present invention.

FIG. 9 is a simplified diagram of a folded spring structure 900 according to an embodiment of the present invention. This diagram is merely an example, which should not unduly limit the scope of the claims herein. One of ordinary skill in the art. would recognize many variations, modifications, and alternatives. As shown, the spring structure includes a rigid substrate structure 903 and a polymer based beam structure 901 including a first end and a second end. The first end is formed opposite of the second end. The structure also has a length defined therebetween. The length is configured as a folded spring structure that includes at least two bends and preferably includes more bends. The first end is coupled 915 to a portion of the substrate structure. Here, the first end was formed in the trench region of the substrate, as shown, and remains in the substrate. The first end is firmly attached to the substrate. The polymer based beam structure has a predetermined width 905 and a predetermined thickness 907. The second end extends from the rigid substrate structure, as also shown.

The folded spring structure also has a spring constant (K) of less than a predetermined amount (e.g., 10 N/m, 1 N/m) characterizing the polymer based beam structure. The second end is capable of moving in a first direction 911, 913 (either positive or negative displacement) characterized by the spring constant upon application of an externally applied force. The second end is also substantially fixed 919 in a second direction, which is normal to the first direction, based upon the configuration of the polymer based beam. Additionally, the polymer based beam is also fixed in a third direction, which is normal to both the first and second directions. The third direction being parallel to the length of the beam structure. The second end is capable of returning to a predetermined state when the externally applied force has been removed. Of course, there can be other variations, modifications, and alternatives.

Figure 10:
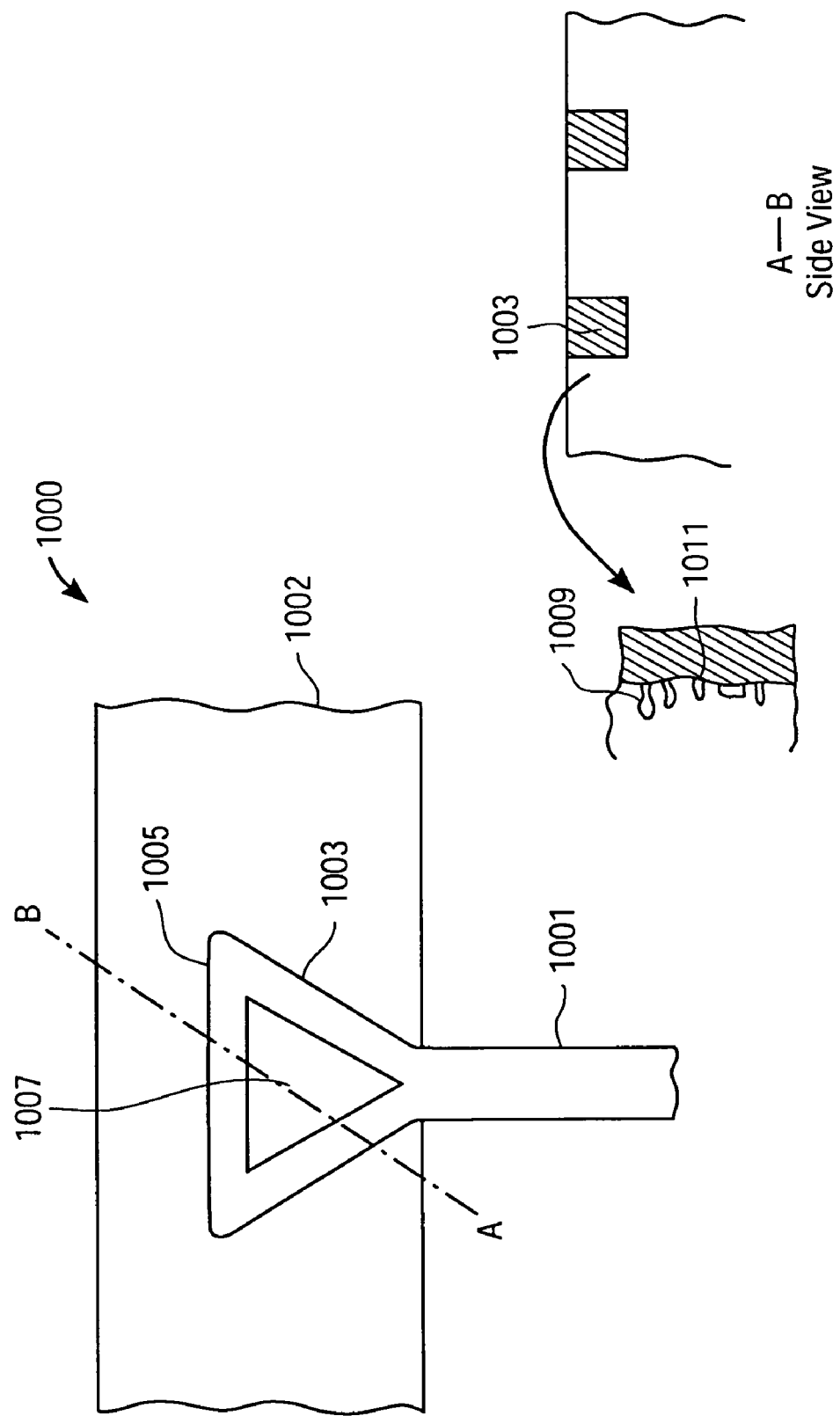
FIG. 10 is a simplified top-view diagram of an integrated beam structure according to an embodiment of the present invention.

FIG. 10 is a simplified top-view diagram 1000 of an integrated beam structure according to an embodiment of the present invention. This diagram is merely an example, which should not unduly limit the scope of the claims herein. One of ordinary skill in the art would recognize many variations, modifications, and alternatives. As shown, an integrated composite beam structure 1000 is illustrated. Preferably, the composite beam structure includes a rigid portion 1002 and a flexible portion 1001 that are integrated with each other. The beam structure has a substrate, which includes a surface and a thickness defined underlying the surface. The substrate is composed of a first material. A thickness of polymer based material includes a first portion, a length, and a second portion. The second portion 1005 is coupled to a portion of the substrate. The length is defined between the first portion and the second portion.

The structure also has a spring constant (K) of less than a predetermined amount (e.g., 10 N/m, 1 N/m) characterizing the length of the polymer based beam structure. The first portion is capable of moving in a first direction characterized by the spring constant upon application of an externally applied force and is substantially fixed in a second direction, which is normal to the first direction. The first portion is capable of returning to a predetermined state when the externally applied force has been removed. Depending upon the embodiment, the structure can be configured as a cantilever, folded spring, or other mechanical structures.

The second portion includes a selected geometric configuration (e.g., triangle, annular, trapezoidal) 1003 to secure the second portion to the portion of the substrate. As shown, the triangular configuration includes substrate region 1007 that is surrounded by triangle region 1003. The substrate region 1007 is preferably attached to other portions of the substrate to firmly anchor the substrate region. The triangular configuration is held by the substrate portion and substantially prevents a possibility of removing the structure from the substrate. The particular shape and size of the second portion is formed via patterning of trench regions, which have been previously described. Of course, the particular shape and size will depend upon the application.

Additionally, the interior surface region of the substrate may be textured 1011 to further facilitate attachment of the polymer member to the substrate. The texture may include a plurality of pores 1009, which will hold polymer material, to anchor portions of such polymer material to the substrate portion. The plurality of pores may be selectively made using processing techniques such as etching and the like, which spatially disposes each of the pores along the surface regions of the substrate. Alternatively, there may be a glue layer disposed between the polymer material and the substrate. A combination of the microscopic pore structures and geometric configuration is desirable to attach the member to the substrate. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims. Additionally, the spring structure can be applied to a variety of application such as accelerometers, seismic sensor, optical deflection devices, and others. Additionally, in certain applications the spring constant K may be larger, although it has been described as being smaller for certain applications. Further details of specific applications of the present invention have been described throughout the present specification and more particularly below.

EXPERIMENTS

To prove the principle and operation of the present invention, we performed various experiments. These experiments are merely examples, which should not unduly limit the scope of the claims herein. One of ordinary skill in the art would recognize many other variations, modifications, and alternatives. We have developed a microfabrication technology for high-aspect ratio applications. Here, a Parylene structure has been developed for soft spring applications and has been applied to in-plane seismometer, which covers a low frequency (<1 Hz) and a small acceleration range. Parylene beams having 10-40 micrometer-wide and an aspect ratio of 10-30 were successfully fabricated. Since Parylene has a small Young's modulus and is generally non-brittle material, high-aspect-ratio robust beam having spring constant on the order of $1\times10^{-3}$ N/m was realized. A prototype capacitive seismometer was also made, and its resonant frequency and noise spectral density was respectively measured to be 37 Hz and 45 $\mu g/Hz^{1/2}$. Since the Brownian noise is only about 25 $ng/Hz^{1/2}$, a seismometer having much lower noise floor may be feasible using this present method and apparatus.

We have developed a microfabrication technology to produce high-aspect ratio Parylene beams with small spring constant. An advantage of using Parylene has been at least multi-fold. Parylene has a small Young's modulus (~4 GPa), which makes easy small spring design. Parylene was a non-brittle material with a large linear-elastic range (yield strain ~3%), which allows large deflection without failure. Here, we present the first in-plane seismometer using the Parylene high-aspect ratio beams.

Figure 11:
FIGS. 11 through 19 illustrate experimental examples according to embodiments of the present invention
Figure 11:

We will also describe a process flow for the high-aspect-ratio Parylene beam fabrication, which is similar to the process described above. The process flow includes: a) Wet oxidation and pattern oxide; b) Make trench by DRIE and 2nd wet oxidation; c) Deposit 10-20 mm-thick Parylene-C; d) Etch back Parylene with O2 plasma; e) Pattern oxide backside and etch through using DRIE; and f) Etch oxide and release Parylene structures, as others. Referring to FIG. 11, we demonstrated a 30 micrometer-width trench including: a) SEM image after the etch back; and b) Photograph of cross section after the second deposition.

Our process started with 4" silicon wafers having 2 micrometer thickness of thermal oxide. The oxide was patterned on the front side, and the substrate is DRIE etched with 400 micrometer-deep trenches. The trenches are used as Parylene mold and their depth defines the desired height of the beams. Then, a second 2 micrometer thermal oxide is grown on all exposed silicon surface as the etch-stop layer for the later DRIE. This oxide growth is followed by a Parylene-C deposition with a thickness of 10-20 micrometer to refill the trenches. The deposition pressure was 22 mT. The Parylene film was then etched back using $O_2$ plasma. Next, the backside oxide is patterned and silicon is etched away from the backside with DRIE to free the Parylene beams, although covered by the thermal oxide. The beams are completely freed by BHF etch of the etch-stop oxide. As previously noted, FIG. 11 (see reference letter a) showed an SEM image of the 30 micrometer-width trench after the etch back of Parylene film. Clearly, the Parylene deposition is conformal, and film thickness inside the trench was almost uniform. Also seen is small void inside, which is caused because the top part of the trench is sealed at the early stage of the deposition. If desirable, this void can be completely eliminated with an etchback and a second Parylene deposition (FIG. 11, reference letter b).

Figure 12:
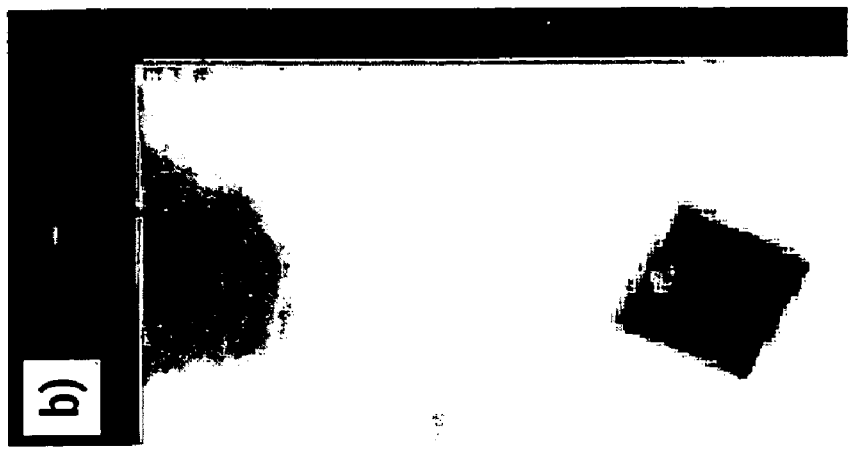
Figure 12:
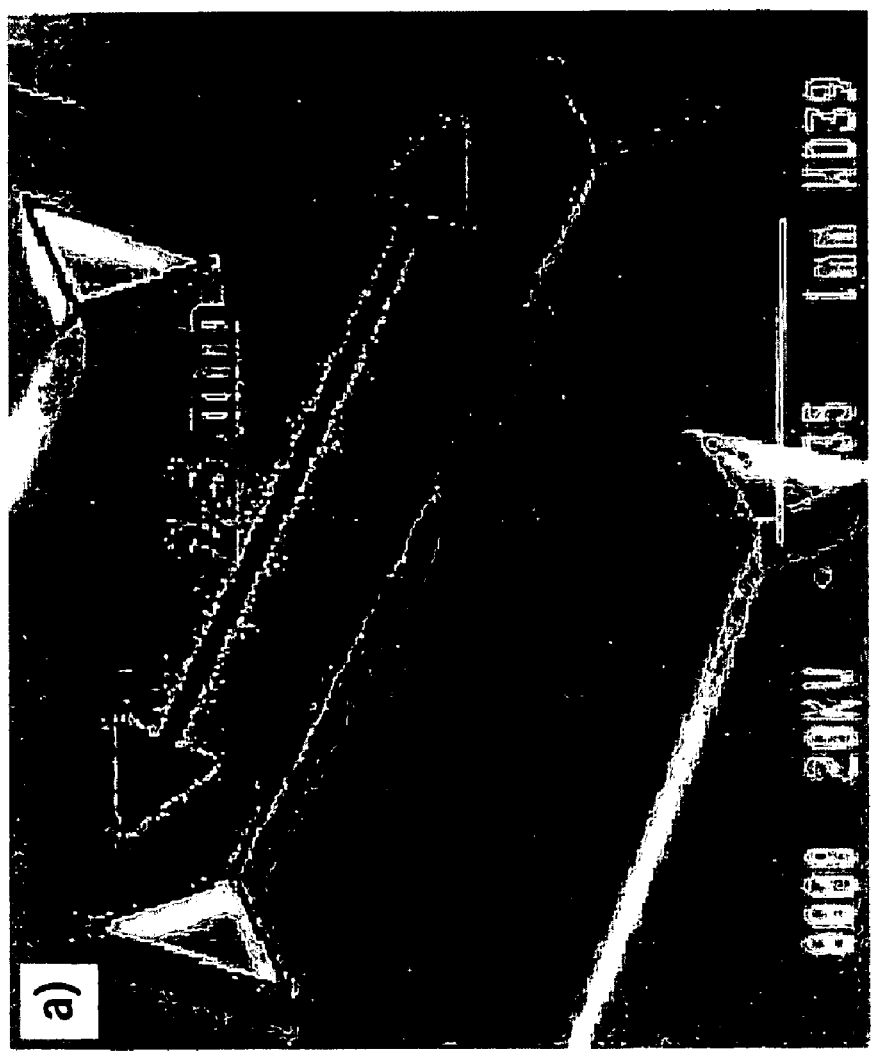

The experiments provided resulting beam structures, as illustrated by FIG. 12, which is a Pendulum using Parylene beam. The figure includes: a) SEM images of high-aspect ratio (thirty) beam and its anchor; and b) pendulum structure using 10 micrometer-width beam suspending 800×800 micrometer Si substrate. The SEM images of the freestanding beam has a 30 micrometer width, 400 micrometer height, and 2.5 millimeter length. As shown, triangle-shaped trench etched into the substrate works well for the anchor. The device was fixed onto a gonio stage and the deflection of the pendulum due to the gravity force was measured by changing the tilt angle. Characteristics of the beam were also measured.

Figure 13:
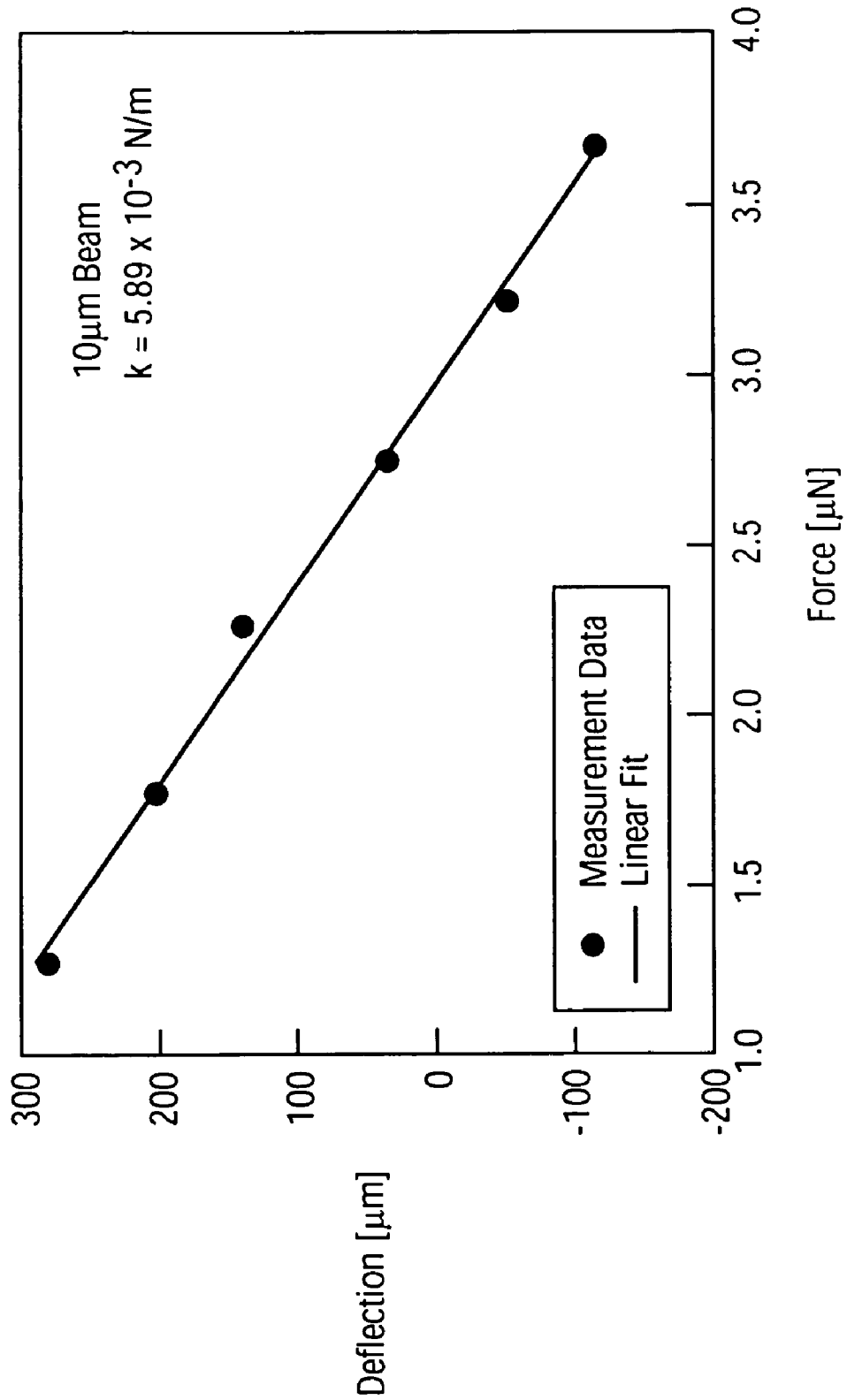

Referring to FIG. 13, deflection of the beam versus the gravity force were illustrated. The spring constant is as low as 0.0059 N/m, a value smaller than the designed value. This is partially because the second deposition of Parylene was not made for this test device, and the cross-section of the beam is U-shaped. It is noted that this soft spring is also robust and will not fracture even by shaking vigorously.

Figure 14:
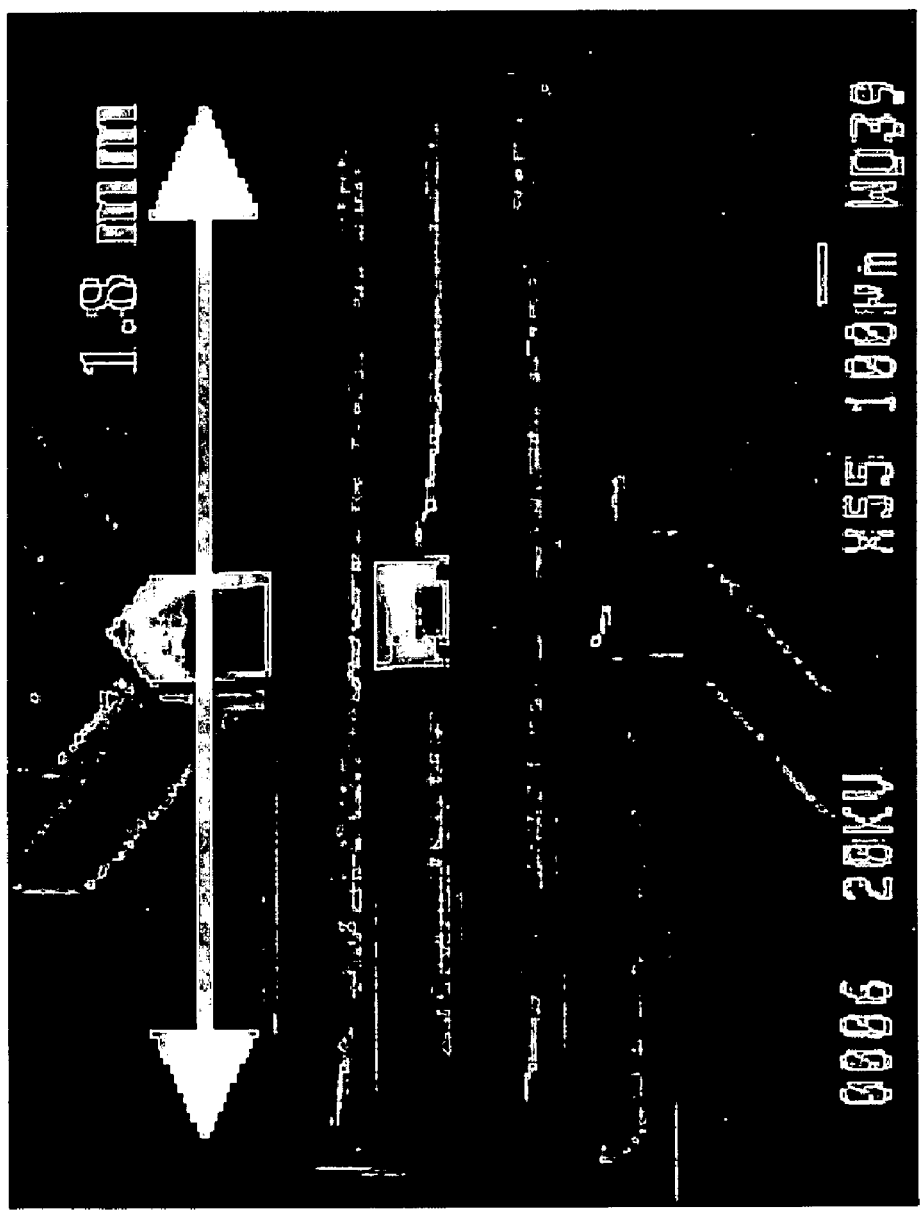
Figure 15:
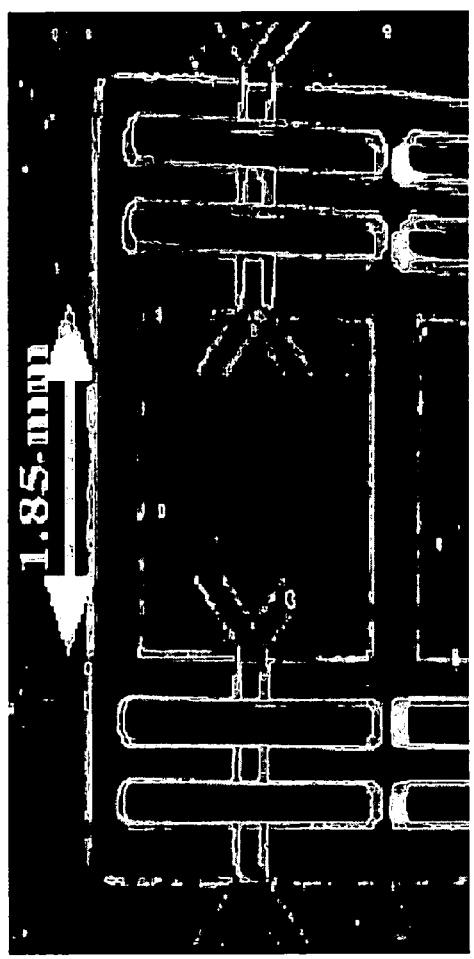
Figure 15:
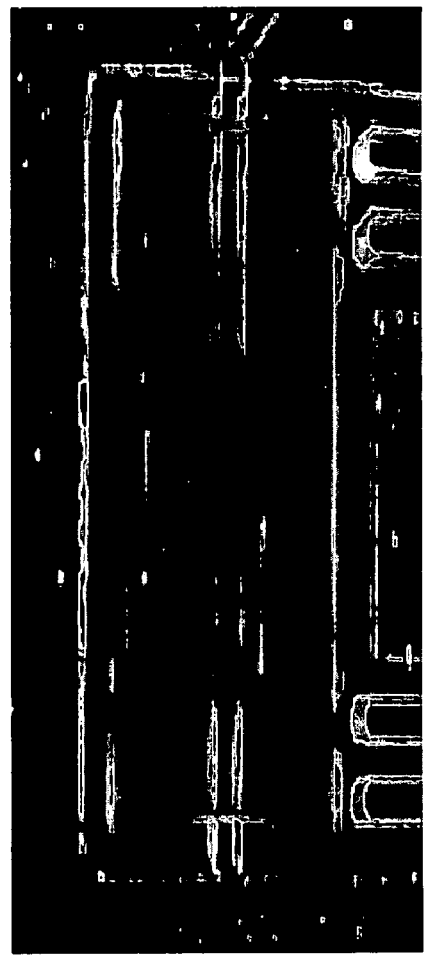
Figure 16:
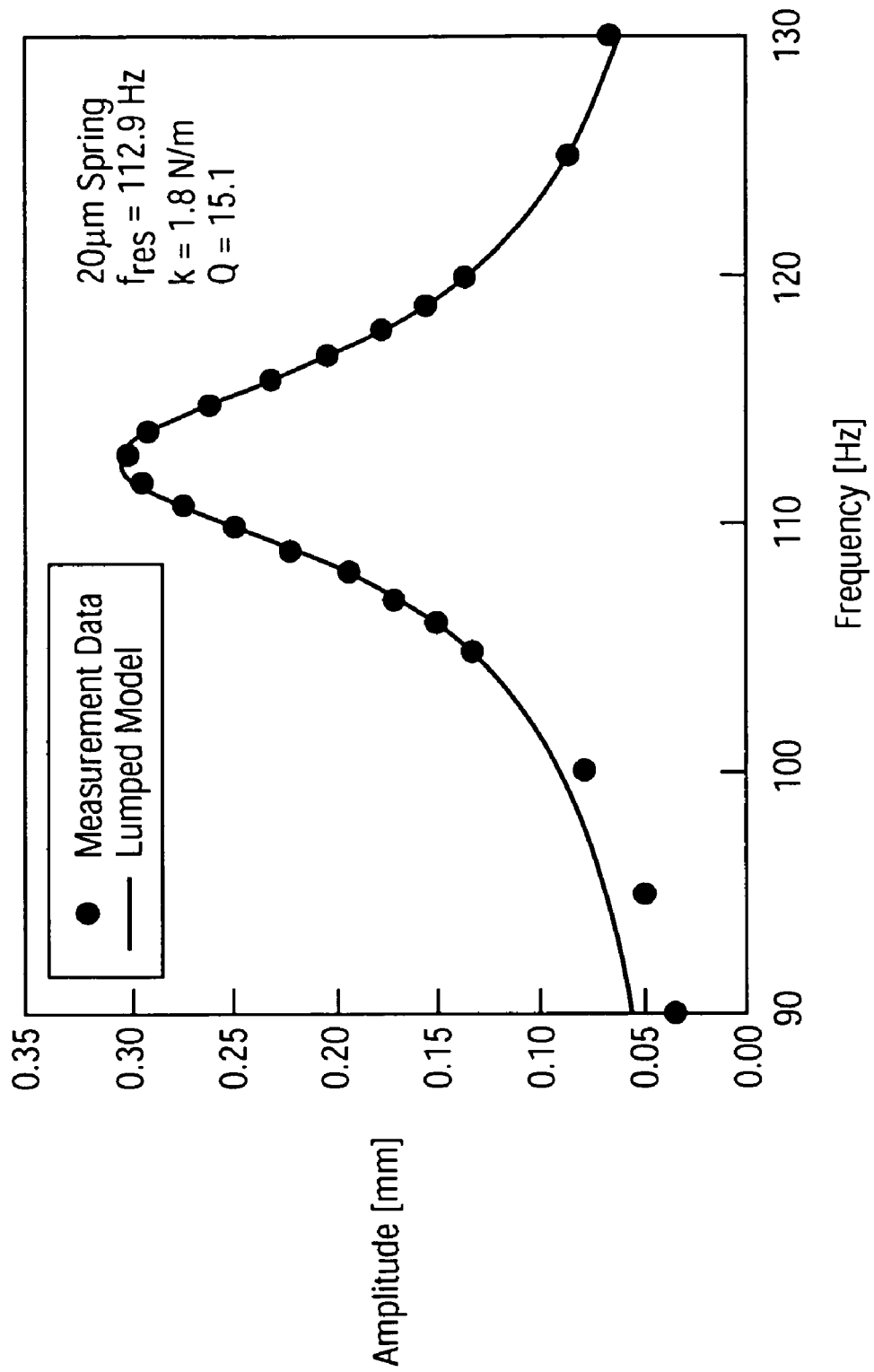

Dynamic response of the Parylene beams were also studied as illustrated by FIGS. 14 and 15. In order to study such dynamic response of the Parylene beams, a 1.75×1.75 mm silicon seismic mass supported with two Parylene leaf springs was fabricated. As shown, FIG. 14 illustrates a SEM image of leaf spring structure using Parylene beam of 20 micrometer width and 400 micrometer height. FIG. 15 illustrates: a) Oscillator prototype having two leaf springs and a 1.75×1.75 mm mass in between; and b) Oscillation at the resonant frequency (~113 Hz). The beams are 20 micrometers in width and 400 micrometers in height. The device was glued onto a loud speaker and shaken in the in-plane direction at prescribed frequency and amplitude. The relative displacement of the seismic mass to the substrate was measured visually using a CCD camera. The CCD camera was equipped with a high magnification lens, and one pixel of the image corresponds to about 3 micrometers. As shown in FIG. 16, the measurement data fit well with a simple spring-mass-damper model, and the resonant frequency $f_{res}$ and quality factor Q are determined to be 112.9 Hz and 15.1, respectively. The peak-to-peak amplitude at the resonance is as large as 600 micrometers, and the neighboring leaf springs are almost attached to each other as shown in the Figure. It is noted that the characteristic of these leaf springs remains unchanged even after being driven at their resonant frequency oscillation for several hours, which corresponds to about 2×10⁶ cycles.

Figure 17:
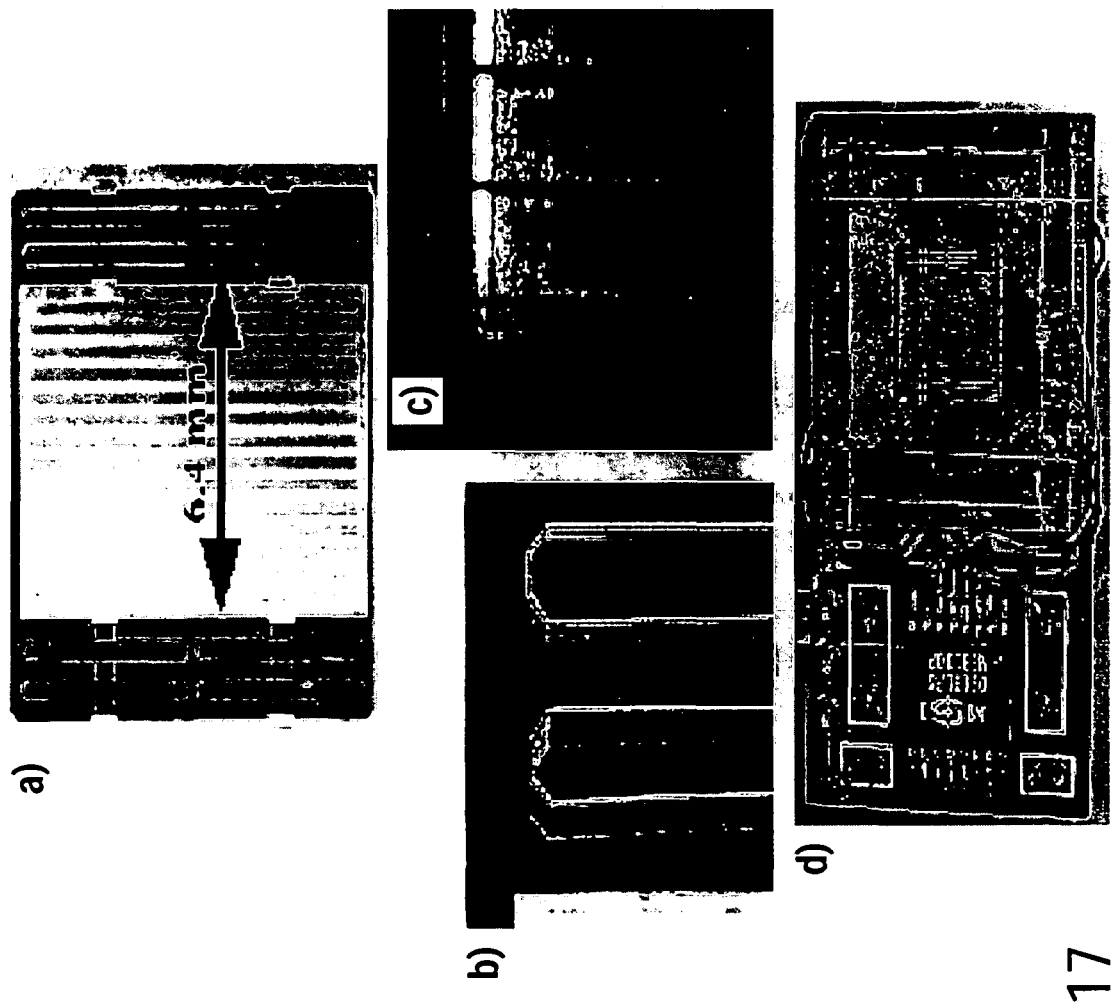

In order to demonstrate an advantage of the Parylene high-aspect ratio beam, prototype of in-plane capacitive seismometer was designed and fabricated. As shown in FIG. 17 (see reference letter a and b), the seismic. mass (9.4×6 mm) is supported with four leaf springs and the electrical contact was made through a Cr/Au/Cr layer (100 Å/2000 Å/100 Å) thermally-deposited on the top of the 20 micrometer-width beams. As further show in FIG. 17: a) Seismic part; b) Magnified view of the leaf spring (20 micrometer wide, 400 micrometer high); c) Magnified view through the counter electrode; and d) Prototype device with a readout IC. Additional details of the process are provided throughout the present specification and more particularly below.

Figure 18:
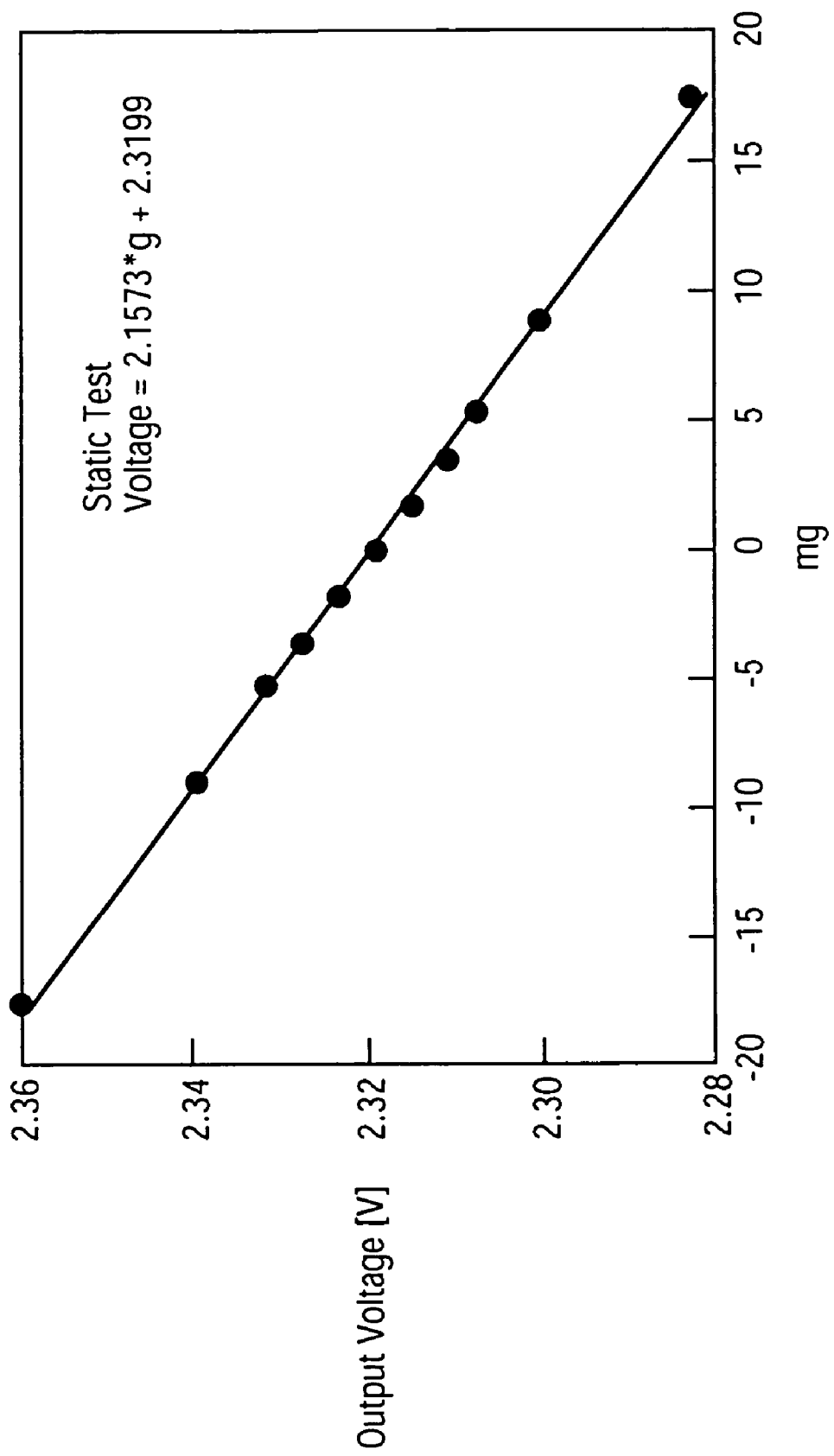

Another Parylene film of 2 micrometer in thickness was deposited on the top of the electrode as the protection layer. The resistance between the substrate and the grid electrodes is 60 Ohms The resonant frequency measured is 37 Hz, which is in good agreement with the designed value of 35 Hz. The displacement of the seismic mass was measured by a capacitance change. Counter electrodes were patterned on a glass wafer and attached to the silicon substrate with a gap of about 100 mm as shown. Also shown is our early prototype seismometer, in which a differential-type readout IC (MicroSensors Inc., MS3110) having a low noise floor of 4 aF/Hz$^{1/2}$ is used. FIG. 18 shows the static response of the seismometer using a tilt experiment. The sensitivity of this prototype is only about 0.221 V/g, which is 5 times smaller than the designed value. This is probably due to the parasitic capacitance, since the gap between electrodes is not small enough when compared with the electrode width. Since the noise floor of the voltage output is about 10 microV/Hz$^{1/2}$, the noise spectral density is 45 μg/Hz$^{1/2}$. Note that, another prototype may have a lower resonant frequency, improved electrode design, and better readout IC settings, and the noise floor of about 1 μg/Hz$^{1/2}$ can be expected with a bandwidth of 20 Hz.

The Brownian equivalent acceleration noise $g_{n,B}$ is given by Equation 1:

$$g_{n,B} = \frac{1}{g}\sqrt{\frac{8\pi kT f_{res}}{MQ}} \; [g/\sqrt{Hz}],$$

where k, T, and M are respectively the Boltzman constant, temperature, and the weight of the seismic mass. See, Bernstein, J., Miller, R., Kelley, W., and Ward, P., "Low-noise MEMS vibration sensor for geophysical applications," *Proc. Solid-Stale Sensor and Actuator Workshop, Hilton Head*, (1998), pp. 55-58. In the present seismometer, $f_{res}$=37 Hz, which we understand may be the lowest resonant frequency among MEMS seismometers ever built. Moreover, the mass M=66 mg is much larger than the mass of previous seismometers. Thus, $g_{n,B}$ given by Equation 1 is as low as 25 ng/Hz$^{1/2}$, and three orders of magnitude smaller than the noise floor measured. Therefore, the noise level of the present seismometer is not be limited by the Brownian noise, and there exists much room to improve its sensitivity.

Figure 19:
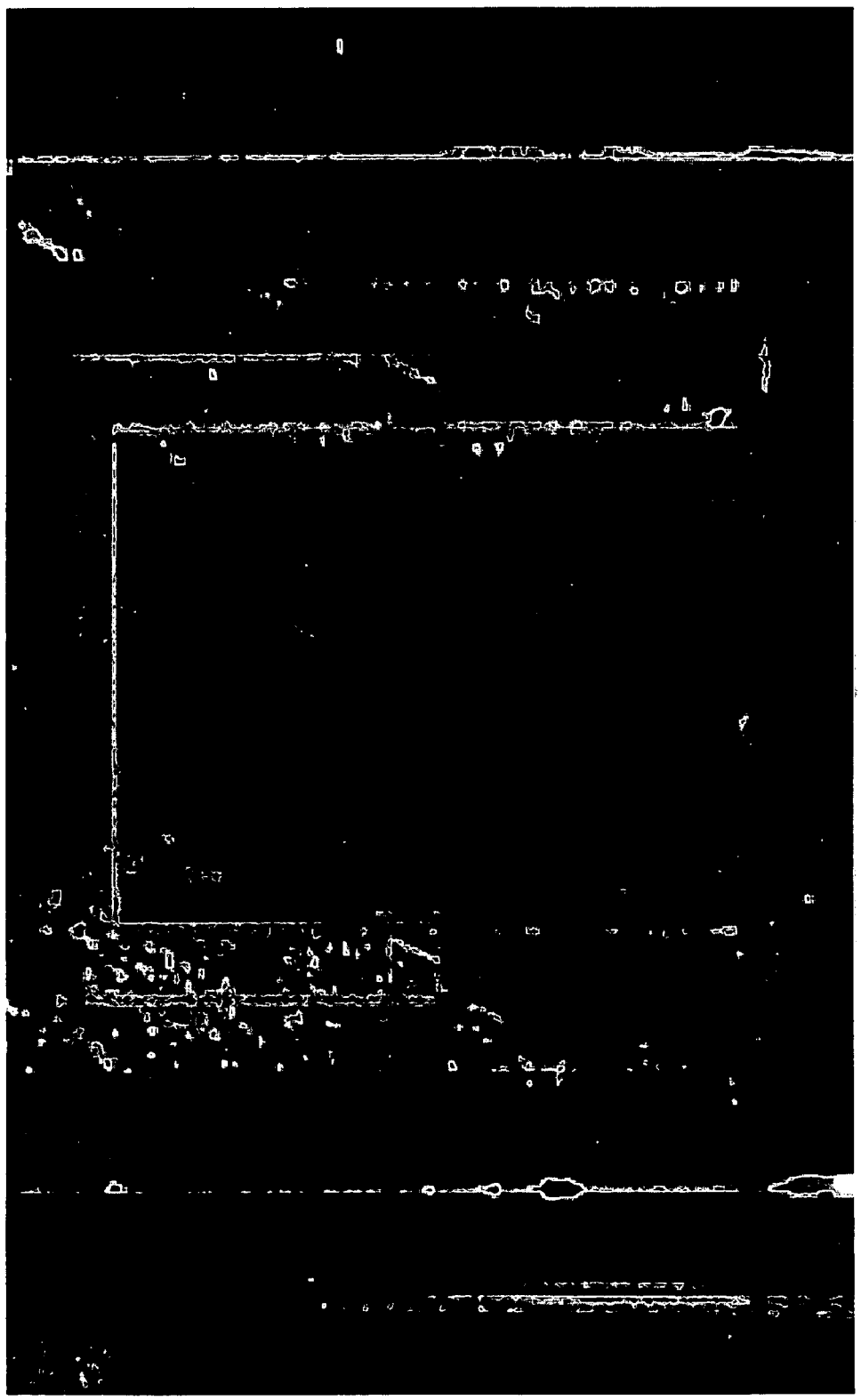

In yet another example, we fabricated a truss structure, as illustrated by FIG. 19. The truss structure used a Parylene high aspect ratio structure. Such structure was characterized by a very soft spring and rigid structure in other aspects at the same time, which were desirable. Of course, there can be other alternatives, modifications, and variations.

A high-aspect-ratio Parylene beam technology is developed. Soft but robust spring is successfully fabricated and fully characterized by a series of experiments. Early prototype of capacitive in-line seismometer having a record-low resonant frequency (37 Hz) was also made. The noise floor is found to be 45 μg/Hz$^{1/2}$, and is not limited by the Brownian noise.

It is also understood that the examples and embodiments described herein are for illustrative purposes only and that various modifications or changes in light thereof will be suggested to persons skilled in the art and are to be included within the spirit and purview of this application and scope of the appended claims. As merely an example, the Parylene material has been deposited according to certain embodiments, other material can be injection molded such as thermoplastics and the like. Of course, there can be other variations, modifications, and alternatives.

What is claimed is:

1. A method for fabricating integrated polymer based structures, the method comprising:

providing a substrate, the substrate comprising a surface and a thickness defined underlying the surface, the substrate being composed of a first material;

forming a recessed region patterned on a portion of the surface of the substrate, the recessed region having a width and a depth characterizing an internal surface portion of the recessed region, the width being defined by a section along a plane that is parallel to the surface of the substrate, the depth being defined by a section from a lower surface region of the recessed region to the portion of the surface of the substrate, the recessed region further comprising a length, the length including a first portion and a second portion;

forming a thickness of polymer based material overlying a portion of the internal surface portion including the lower portion of the recessed region, the polymer based material conforming to the portion of the internal surface portion and filling the recessed region, the polymer based material also overlying the first portion and the second portion of the length of the recessed region; and removing a portion of the substrate within a vicinity of the recessed region to release a first portion of the polymer based material to facilitate a removal of the first portion of the polymer based material from the portion of the substrate while maintaining a second portion of the polymer based material coupled to the portion of the substrate, wherein said first portion of the polymer based material survives said removing the portion of the substrate within the vicinity of the recessed region.

2. The method of claim 1 wherein the substrate comprises a silicon material.

3. The method of claim 1 wherein the substrate is a silicon substrate or a glass substrate.

4. The method of claim 1 wherein the width and depth of the recessed region define an aspect ratio, the aspect ratio being greater than two.

5. The method of claim 1 wherein the removing of the portion of the substrate from the first portion of the polymer based material comprises an etching process, the etching process selectively removes the portion of the substrate from the portion of the polymer based material.

6. The method of claim 1 wherein the polymer based material is parylene.

7. The method of claim 1 wherein the polymer based material is polyimide, PEEK, or polycarbonate.

8. The method of claim 1 wherein the recessed region is a trench structure.

9. The method of claim 1 wherein the released first portion of the polymer based material forms a beam structure, the beam structure extending from the second portion of the polymer based material.

10. The method of claim 1 wherein the width is less than 100 microns and the depth is greater than 10 microns.

11. The method of claim 1 further comprising forming a texture within the internal surface portion and then forming the thickness of the polymer based material, the texture facilitating attachment of the polymer based material to the substrate.

12. The method of claim 11 wherein the texture comprises a plurality of pores spatially disposed on the internal surface portion.

13. The method of claim 12 wherein the plurality of pores forms a roughened region on the internal surface portion.

14. The method of claim 1 further comprising completely removing the first portion of the polymer based material from the portion of the substrate.

15. The method of claim 1 wherein the polymer based material comprises a parylene, the parylene being provided by chemical vapor deposition.

16. The method of claim 1 wherein the polymer based material is a homogenous structure.

17. The method of claim 1 wherein the released first portion of the polymer based material is characterized by a spring constant (K) of less than 10 N/m.

18. The method of claim 1 wherein the released first portion of the polymer based material is characterized by a spring constant (K) of less than 10 N/m and wherein the released first portion of the polymer based material forms a cantilever style spring structure.

19. The method of claim 1 wherein the released first portion of the polymer based material has a spring constant (K) of less than 10 N/m and wherein the released first portion of the polymer based material forms a folded spring structure.

20. The method of claim 1:
wherein the substrate comprises a silicon bearing material;
wherein the forming of the recessed region includes patterning and etching the portion of the surface of the substrate;
wherein the forming of the thickness of polymer based material is provided by chemical vapor deposition; and
wherein the removing of the portion of the substrate within the vicinity of the recessed region comprises patterning a portion of the substrate and etching the patterned portion to release the first portion of the polymer based material.

21. The method of claim 1 wherein the second portion of the polymer based material is integrated into the substrate.

22. A method for fabricating polymer based structures for manufacture of MEMS elements, the method comprising:
providing a substrate, the substrate comprising a surface and a thickness defined underlying the surface, the substrate being composed of a first material;
forming a recessed region patterned on a portion of the surface of the substrate, the recessed region having a width and a depth characterizing an internal surface portion of the recessed region, the width being defined by a section along a plane that is parallel to the surface of the substrate, the depth being defined by a section from a lower surface region of the recessed region to the portion of the surface of the substrate;
forming a thickness of polymer based material overlying a portion of the internal surface portion including the lower portion of the recessed region, the polymer based material conforming to the portion of the internal surface portion and filling the recessed region; and
removing a portion of the substrate within a vicinity of the recessed region to release a portion of the polymer based material to facilitate a removal of the portion of the polymer based material from the portion of the substrate; wherein the portion of the polymer based material that has been removed forms a molded polymer based structure.

* * * * *

UNITED STATES PATENT AND TRADEMARK OFFICE
CERTIFICATE OF CORRECTION

PATENT NO. : 7,774,930 B2  Page 1 of 1
APPLICATION NO. : 11/492836
DATED : August 17, 2010
INVENTOR(S) : Yu-Chong Tai and Yuji Suzuki It is certified that error appears in the above-identified patent and that said Letters Patent is hereby corrected as shown below:

In the Specification:

On page 1, column 1, line 17; under heading "STATEMENT AS TO RIGHTS TO INVENTIONS MADE UNDER FEDERALLY SPONSORED RESEARCH OR DEVELOPMENT", please replace "NOT APPLICABLE" with -- The work described herein was carried out with the use of federal research funding by Defense Advanced Research Projects Agency under grant no. DARPA DAAH01-01-1-R002. The Federal government reserves certain rights in the patent. --

Signed and Sealed this
Fourteenth Day of June, 2011

David J. Kappos
*Director of the United States Patent and Trademark Office*